United States Patent
Yang

(10) Patent No.: US 9,184,746 B2
(45) Date of Patent: Nov. 10, 2015

(54) CONTACTLESS SWITCH AND ASSOCIATED METHOD

(75) Inventor: Chih-Shih Yang, Taipei (TW)

(73) Assignee: PROLIFIC TECHNOLOGY INC., Taipei (TW)

( * ) Notice: Subject to any disclaimer, the term of this patent is extended or adjusted under 35 U.S.C. 154(b) by 899 days.

(21) Appl. No.: 13/033,219

(22) Filed: Feb. 23, 2011

(65) Prior Publication Data

US 2011/0221550 A1    Sep. 15, 2011

(30) Foreign Application Priority Data

Mar. 10, 2010   (TW) ................................ 99106874 A

(51) Int. Cl.
*H01H 9/00*   (2006.01)
*H03K 17/95*  (2006.01)

(52) U.S. Cl.
CPC ................................ *H03K 17/9515* (2013.01)

(58) Field of Classification Search
CPC ................................ H03K 3/00; H01H 9/00
USPC ....................................................... 307/108
See application file for complete search history.

(56) References Cited

U.S. PATENT DOCUMENTS

| | | | | |
|---|---|---|---|---|
| 5,254,879 | A | * | 10/1993 | Jackson ......................... 307/116 |
| 6,212,052 | B1 | * | 4/2001 | Heuer et al. ................... 361/160 |
| 6,288,919 | B1 | * | 9/2001 | Jain ................................. 363/89 |
| 2007/0115135 | A1 | * | 5/2007 | Mulhouse et al. ............. 340/644 |
| 2007/0279017 | A1 | * | 12/2007 | Lin et al. ....................... 323/222 |
| 2008/0128453 | A1 | * | 6/2008 | Burckholter et al. ........... 222/75 |
| 2009/0167539 | A1 | * | 7/2009 | Motoe et al. .................. 340/600 |
| 2011/0115476 | A1 | * | 5/2011 | Kapser et al. ............... 324/207.2 |
| 2011/0140644 | A1 | * | 6/2011 | Jeung ........................ 318/400.24 |

\* cited by examiner

*Primary Examiner* — Rexford Barnie
*Assistant Examiner* — Toan Vu
(74) *Attorney, Agent, or Firm* — WPAT, PC; Justin King

(57) ABSTRACT

A contactless switch provided by the present disclosure is coupled to a signal input device and receives a magnetic signal generated by a magnetic trigger mechanism. The contactless switch includes: a magnetic sensor, for sensing the magnetic signal and generating a corresponding trigger control signal; a controller, for generating a switch signal according to the trigger control signal; and a mode switch module, for processing the input signal to generate an output signal according to the switch signal.

6 Claims, 3 Drawing Sheets

CONTACTLESS SWITCH AND ASSOCIATED METHOD

FIELD OF THE INVENTION

The present invention relates to a power control apparatus, and more particularly, to a contactless switch.

BACKGROUND OF THE INVENTION

Conventional power switches are generally contact-operable. With reference to FIG. 1 showing a block diagram of a conventional power switch 1 comprising a contact trigger mechanism 10 and a switcher 12. The switcher 12 operates, i.e., connects or disconnects a power supply, as the contact trigger mechanism 10 is triggered by a user contact. It is to be noted that the trigger mechanism 10 is a contact-operable only structure, which connects or disconnects a power supply by determining whether a metal touch point is contacted. However, the metal touch point is prone to wear resulted from prolonged friction, or even to poor contact due to metal oxidation.

Therefore, there is a need for a solution overcoming the drawbacks associated with the conventional power switches.

SUMMARY OF THE INVENTION

It is an objective of the present disclosure to provide a contactless power switch that overcomes drawbacks of wear, oxidation and fatigue due to prolonged friction at an internal touch point of a conventional switch.

The present disclosure provides a contactless switch that is coupled to a signal input device and receives a magnetic signal generated by a magnetic trigger mechanism. The contactless switch comprises: a magnetic sensor, for sensing the magnetic signal and generating a corresponding trigger control signal; a controller, for generating a switch signal according to the trigger control signal; and a mode switching module, for processing the input signal to generate an output signal according to the switch signal.

The present disclosure further provides a contactless switch that is coupled to a signal input device. The contactless switch comprises: a magnetic trigger mechanism, for generating a magnetic signal according to a user trigger; a magnetic sensor, for sensing the magnetic signal and generating a corresponding trigger control signal; a controller, for generating a switch signal according to the trigger control signal; and a mode switch module, for processing the input signal to generate an output signal according to the switch signal.

The present disclosure also provides a method for controlling a contactless switch coupled to a signal input device. The method comprises: generating a magnetic signal according to a user trigger, sensing the magnetic signal to generate a corresponding trigger control signal, generating a switch signal according to the trigger control signal, and processing the input signal to generate an output signal according to the switch signal.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE PREFERRED EMBODIMENT

Figure 1:
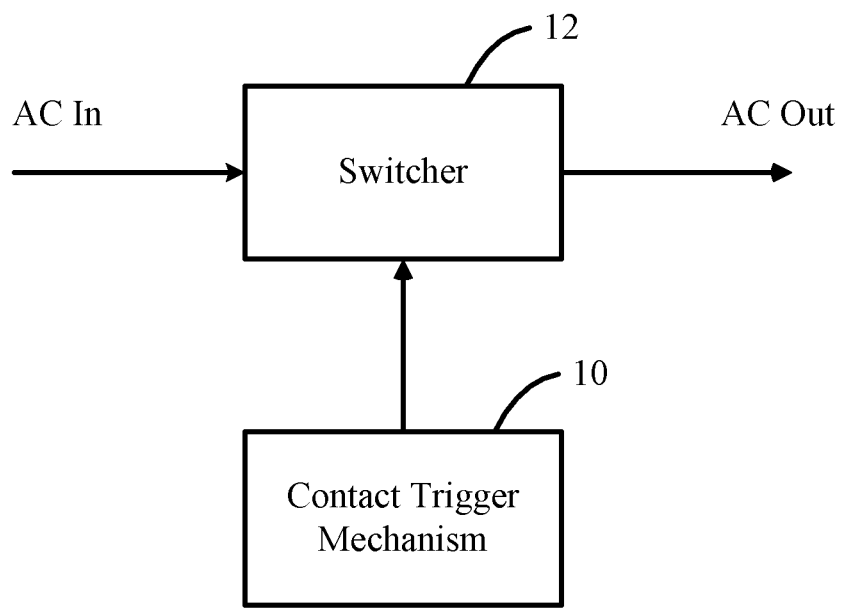
FIG. 1 is a schematic diagram of conventional power switch.
Figure 2:
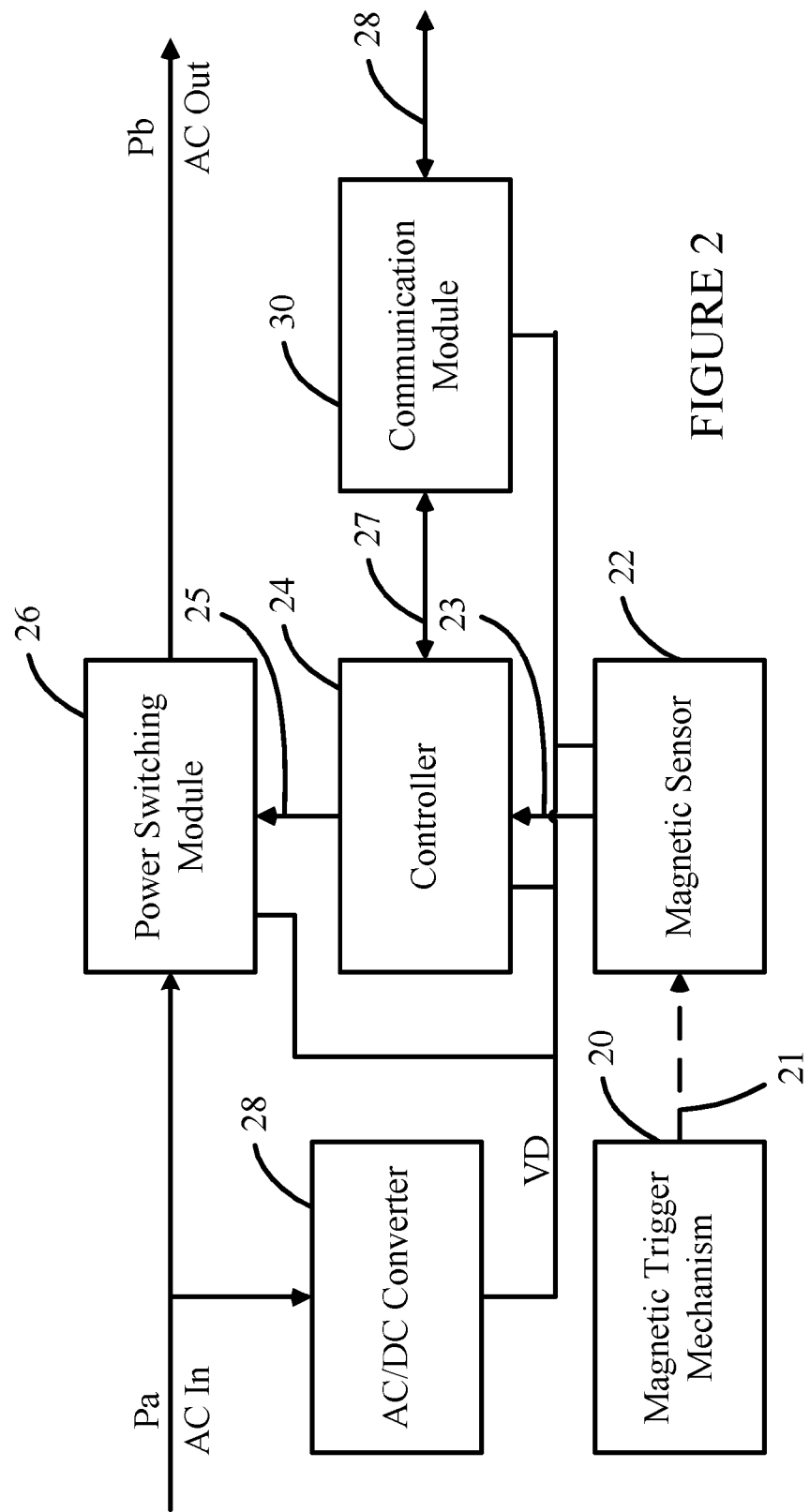
FIG. 2 is a schematic diagram of a contactless power switch according to the present disclosure.

With reference to FIG. 2 showing a schematic diagram of functional blocks of a contactless power switch 2 according to one preferred embodiment of the present disclosure. The contactless power switch 2 comprises a magnetic trigger mechanism 20, a magnetic sensor 22, a controller 24, a power switching module 26, an AC/DC converter 28 and a communication module 30.

The AC/DC converter 28 converts an AC electricity Pa into a DC current VD, which is then provided an operating power to the magnetic sensor 22, the controller 24, the power switching module 26 and the communication module 30 under normal operation. Further, the AC/DC converter 28 also provides DC voltages of different levels to accommodate the magnetic sensor 22, the controller 24, the power switching module 26 and the communication module 30 that operate under different DC voltages, e.g., 3.3V or 5V. It is to be noted that a single DC power VD in FIG. 2 is an illustrative example and is not to be construed as limiting the scope of the present invention.

Figure 3:
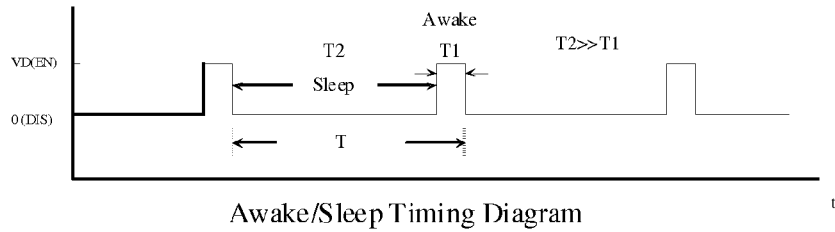
FIG. 3 is a timing diagram illustrating awake and sleep modes.

In order to meet environmental friendly factors of energy conservation and carbon reduction, the contactless switch of the invention is also designed to be power saving. For example, the AC/DC converter 28 is controlled to output the DC power VD by an awake/sleep cycle with a timing diagram as shown in FIG. 3. In FIG. 3, under an awake mode T1, the AC/DC converter 28 outputs the DC power VD to provide an operating voltage to the magnetic sensor 22, the controller 24, the power switching module 26 and the communication module 30. In contrast, under a sleep mode T2, the AC/DC converter 28 is disabled with no DC power VD generated therefrom. Accordingly, lower power dissipation to even no power dissipation is achieved under the sleep mode. Preferably, the awake mode T1 and the sleep mode T2 alternate cyclically, and the duration of the sleep mode T2 is far greater than that the awake mode T1, i.e., T2>>T1.

The magnetic trigger mechanism 20 first receives a user trigger, and the magnetic sensor 22 operates in conjunction to sense the user trigger. According to the contactless power switch 2 of the present disclosure, the magnetic trigger mechanism 20 and the magnetic sensor 22 operate on magnetic basis through a magnetic signal 21 in FIG. 2, i.e., there is no contact between the two, and are therefore free from drawbacks of wear, oxidation and fatigue resulted from prolonged friction at a metal touch point of the conventional power switch. For example, the magnetic trigger mechanism 20 can be a rocker, slide, pushbutton, rotary, toggle, or tact mechanism. By simply disposing a magnet at an appropriate position of the magnetic sensor 22, the magnetic sensor 22 is capable of sensing a user trigger. Preferably, the magnetic sensor 22 can be a Hall-effect sensor, magnetic-resistive sensor, magnetic-inductive sensor, or magnetic-impedance sensor. Once the magnetic signal 21 generated by the magnetic trigger mechanism 20 from the user trigger is sensed by the magnetic sensor 22, a corresponding trigger control signal 23 is generated and provided to the controller 24.

Figure 4:
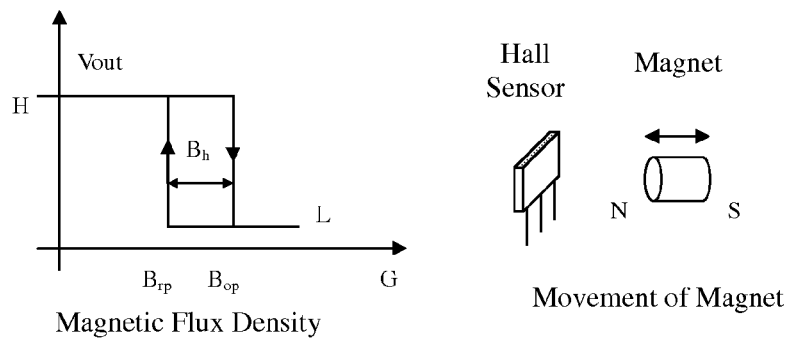
FIG. 4 is an operating output status of a Hall-effect sensor.
Figure 5:
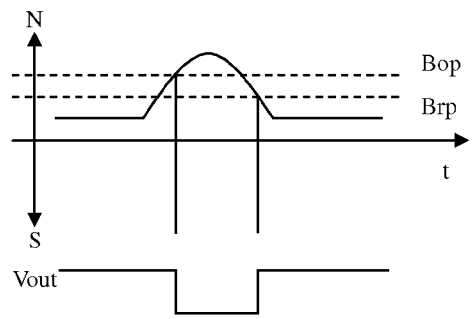
FIG. 5 is a waveform of an output Vout of a Hall-effect sensor.

Preferably, the magnetic sensor 22 is realized by utilizing a Hall-effect sensor that detects a position of a magnet through detecting magnetic fields. FIG. 4 shows a schematic diagram of an operating output status of a Hall-effect sensor. As the magnet gets closer to Hall-effect sensor, the magnetic flux density increases till reaching a sensor operating point Bop, at which then an output Vout of the Hall-effect sensor changes from a logic-high level to a logic-low level. In contrast, as the magnet gets farther from the Hall-effect sensor, the magnetic flux density decreases till a sensor magnetism releasing point Brp, at which then the sensor output Vout changes from a logic-low level to a logic-high level. FIG. 5 shows a waveform of an output Vout of a Hall-effect sensor.

Again referring to FIG. 2, the controller 24 is in charge of an overall operation of the contactless power switch 2. Preferably, the controller 24 is a microprocessor, and controls operations of the various units of the contactless power switch 2 according to predetermined control firmware or software through an internal or external memory (not shown in the drawing). The internal or external memory is, for example, a programmable read-only memory (PROM), an erasable programmable read-only memory (EPROM), and electronically erasable programmable read-only memory (EEPROM), or a flash memory. Upon receiving the trigger control signal 23 generated by the magnetic sensor 22, the controller 24 determines the user trigger upon the contactless power switch 2 and generates a corresponding switch signal 25 to the power switching module 26. The power switching module 26 accordingly performs power switching operations according to the switch signal 25. Further, the power switching module 26 is designed to match operations of the magnetic trigger mechanism 20 and the magnetic sensor 22. For example, for the magnetic trigger mechanism 20 having two statuses of open and short, the power switching module 26 needs providing two statuses of only directly coupling the AC power Pa to the output end to act as a output AC power Pb, or disconnecting the AC power Pa. Supposing the magnetic trigger mechanism 20 provides three or more statuses, the power switching module 26 may then comprise a regulator, a transformer, a switch or a multiplexer, so as to output multiple voltages or currents at the output end of the power switching module 26. For example, the power switching module 26 also comprises an over-voltage or over-current protecting circuit that cuts off the voltage or current in the event of over-current or over-voltage to ensure user safety.

For example, the power switching module 26 would further comprise an AC/DC converter that provides one or multiple DC output currents or output voltages at the output end thereof. It is to be noted that a single AC power at the output end of the power switching module 26 is shown in FIG. 2 for illustrative purposes, and is not to be construed as limiting the scope of the present invention. For example, the output of the power switching module 26 can be an AC power or a DC power under the spirit of the present invention. The switch of the present disclosure may also be applied to a knob for light brightness or volume adjustment, as the term "switch" according to the present disclosure encompasses switches of any form.

Additionally, to satisfy regional security systems, such as a home security system, the contactless power switch of the present invention is connectable to a wired local network, a wireless network (e.g., WiMax or WiFi), or a mobile communication network (e.g., 2G, 3G, or 4G). Hence, the contactless power switch 2 according to the present disclosure further comprises a communication module 30, which establishes a connection through a wired local network, a wireless network or a mobile communication network by transceiving a communication signal 28 (e.g., a wired signal or a wireless signal), so as to enable a user to control the contactless power switch 2 according to the present disclosure at a remote end for functions including turning on and off, time, and adjustment. Further, the communication module 30 is coupled to a bi-directional bus of the controller 24 to accomplish signal transmission and data control by transmitting the control signal 27.

While the invention has been described in terms of what is presently considered to be the most practical and preferred embodiments, it is to be understood that the invention needs not to be limited to the above embodiments. On the other hand, it is intended to cover various modifications and similar arrangements included within the spirit and scope of the appended claims which are to be accorded with the broadest interpretation so as to encompass all such modifications and similar structures.

What is claimed is:

1. A contactless switch, coupled to an alternating current input power, comprising:
    a magnetic trigger mechanism, for generating a magnetic signal according to a user trigger;
    a Hall effect sensor, for sensing said magnetic signal and generating a corresponding trigger control signal;
    a controller, for generating a switch signal according to said trigger control signal;
    a power switching module, for processing said alternating current input power to an output power according to said switch signal; and
    a power converter for converting said alternating current input power to an operating power of said controller;
    wherein said power converter is controlled by an awake/sleep cycle, said power converter outputs said operating power to said Hall effect sensor, said controller and said power switching module during an awake mode of said awake/sleep cycle, and said power converter does not output said operating power during a sleep mode of said awake/sleep.

2. The contactless switch as claimed in claim 1, wherein said power converter is an AC/DC converter.

3. The contactless switch claimed in claim 1, further comprising a communication module, which is coupled to the controller and transceives through one of a wireless local network, a wireless network, and a mobile communication network.

4. A method for controlling a contactless switch, the contactless switch being coupled to an input power, the method comprising:
    generating a magnetic signal according to a user trigger;
    sensing the magnetic signal by means of the Hall effect and generating a corresponding trigger control signal;
    generating a switch signal according to the trigger control signal;
    processing said alternating current input power to an output power according to said switch signal;
    converting said alternating current input power to an operating power; and
    controlling provision of the operating power according to an awake/sleep cycle;
    outputting said power switching module during an awake mode of said awake/sleep cycle; and said no operating power during a sleep mode of said awake/sleep.

5. The method as claimed in claim 4, further comprising converting said input power to a DC power as the operating power.

6. The method as claimed in claim 4, further comprising transceiving via one of a wireless local network, a wireless network, and a mobile communication network.

\* \* \* \* \*